United States Patent [19]

Hornbeck et al.

[11] 4,266,234
[45] May 5, 1981

[54] PARALLEL READOUT STRATIFIED CHANNEL CCD

[75] Inventors: Larry J. Hornbeck, Van Alstyne; Harold H. Hosack, Dallas, both of Tex.

[73] Assignee: Texas Instruments Incorporated, Dallas, Tex.

[21] Appl. No.: 869,398

[22] Filed: Jan. 16, 1978

[51] Int. Cl.³ .................... H01L 29/78; H01L 27/14; H01L 31/00; G11C 19/28
[52] U.S. Cl. ...................................... 357/24; 357/30; 307/221 D
[58] Field of Search ............... 357/24, 30; 307/221 D; 250/211 J

[56] References Cited

U.S. PATENT DOCUMENTS

| | | | |
|---|---|---|---|
| 3,739,240 | 6/1973 | Krambeck | 357/24 |
| 3,852,799 | 12/1974 | Walden | 357/24 |
| 3,852,801 | 12/1974 | Itoh et al. | 357/24 |
| 3,864,722 | 2/1975 | Carnes | 357/24 |
| 4,032,952 | 6/1977 | Ohba et al. | 357/24 |

FOREIGN PATENT DOCUMENTS 2638942 3/1977 Fed. Rep. of Germany ............. 357/24
2712479 10/1977 Fed. Rep. of Germany ............. 357/24

*Primary Examiner*—Gene M. Munson
*Attorney, Agent, or Firm*—William E. Hiller; Melvin Sharp; Jim Comfort

[57] ABSTRACT

A parallel readout stratified channel CCD includes a plurality of parallel spaced apart charge transfer channels lying in a semiconductor substrate. A barrier region lies under and adjacent to all the charge transfer channels and their separating regions. A charge integration channel lies under and adjacent to the barrier region. The substrate and barrier region have dopant of atoms of a first type; while a charge integration channel has dopant of atoms of a second type opposite to the first type. An insulating layer overlies the charge transfer channel, and a plurality of phase electrodes are serially disposed thereon transversely to all of the charge transfer channels. Further included are interchannel transfer regions under selected portions of predetermined ones of the electrodes. These enable localized interchannel charge transfer. In operation, charge packets are selectively transferred from particular portions of the charge integration channel to the parallel charge transfer channels; and are subsequently read in parallel therefrom.

10 Claims, 30 Drawing Figures

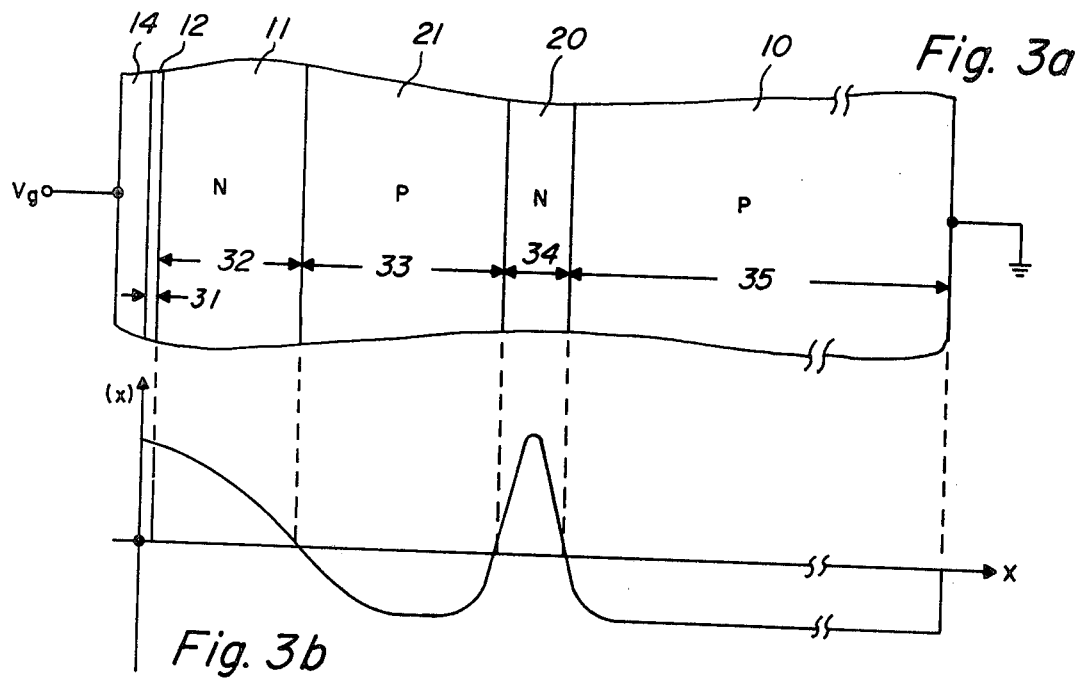

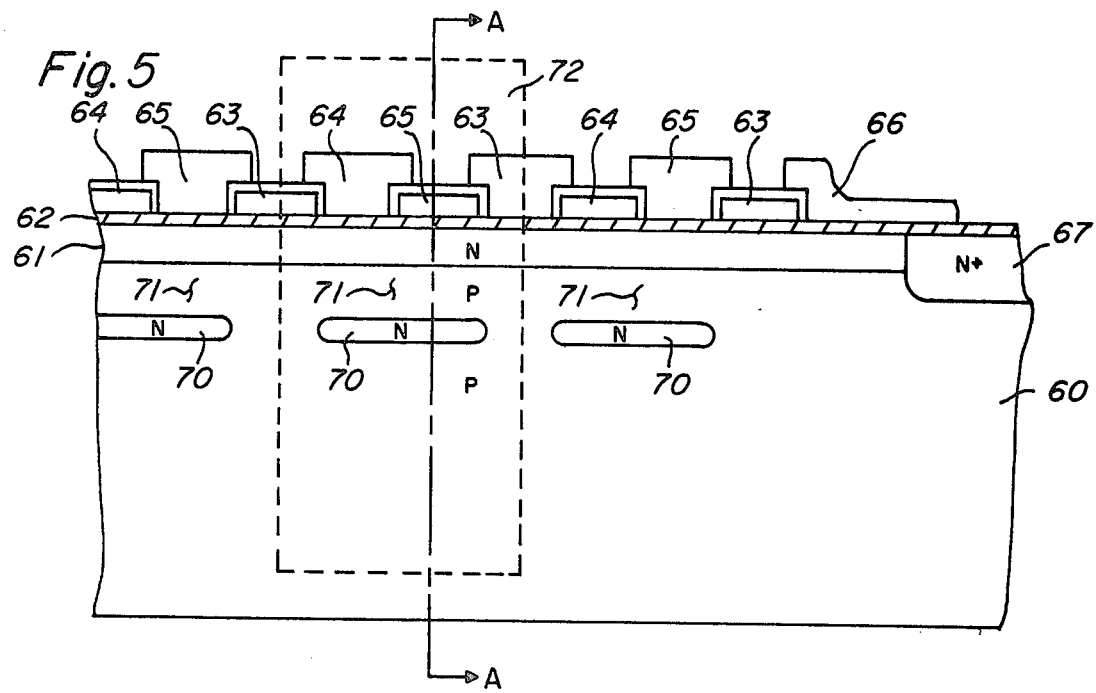

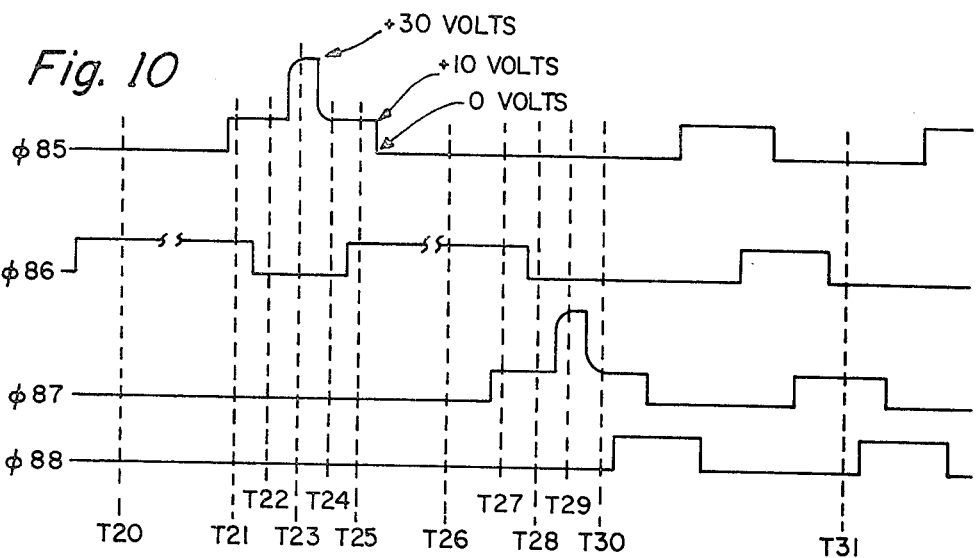
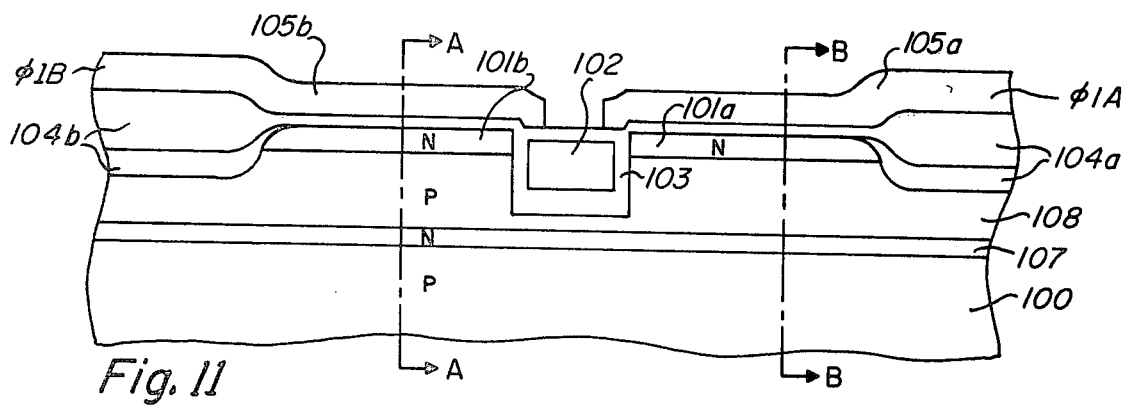
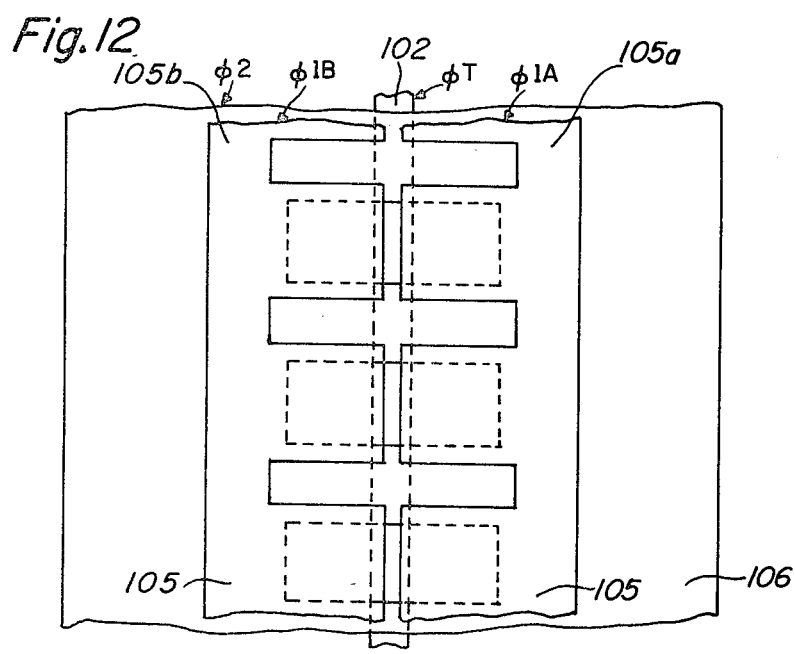

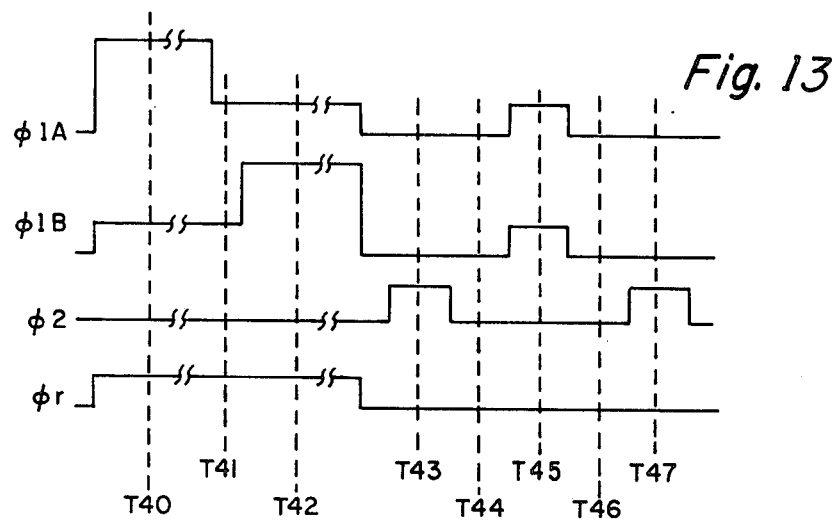
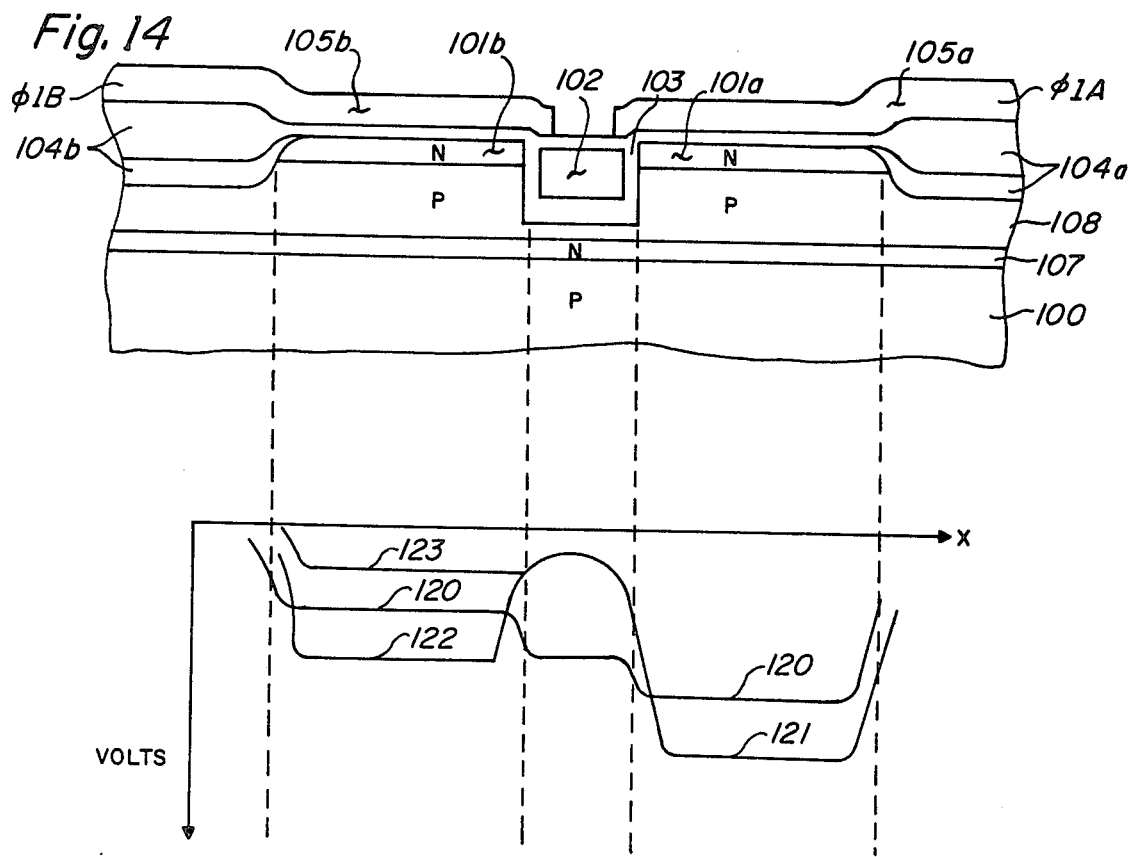

PARALLEL READOUT STRATIFIED CHANNEL CCD

CROSS REFERENCE TO RELATED APPLICATIONS

This specification discloses subject matter related to that set forth in the following copending U.S. Pat. applications: Ser. No. 869,399, filed Jan. 16, 1978 by Larry J. Hornbeck; and Ser. No. 869,735, filed Feb. 7, 1978 by Larry J. Hornbeck; both of which are assigned to the assignee of the present invention.

BACKGROUND OF THE INVENTION

This invention relates to charge coupled devices and more particularly to charge coupled imagers. Basically, a charge coupled device is comprised of a semiconductor substrate having dopant atoms of one type and having a first surface. Charge transfer channels are defined in the substrate near the first surface. An insulating layer lies on the first surface; and a plurality of phase electrodes lie thereon. The phase electrodes are serially disposed over the charge transfer channels. Clocking signals are applied to the phase electrodes for propagating minority carrier charge packets along the channel toward an output end.

In a charge coupled device imager, a plurality of photoelectric charge accumulation sites (picture elements) are also defined in the substrate. Light waves of a predetermined frequency band (e.g., visible light) are directed to fall either on the front side or back side of the device; and minority carrier charges are generated within the substrate in proportion to the intensity of the incident light. These photon generated charges are accumulated in packets at the photoelectric charge accumulation sites. Subsequently, the charge packets are read out via application of clocking signals to the phase electrodes.

In the past, one form of charge coupled device imager had a "frame transfer" type of structure. This structure is described for example in U.S. Pat. No. 3,801,884 entitled, "Charge Transfer Imaging Devices" which was issued to Sequin on Apr. 2, 1974. As therein disclosed, the frame transfer imager is comprised basically of a sensor, a temporary storage array, and a parallel-serial register. The sensor includes an array of photoelectric charge accumulation sites, which may suitably be arranged in a number of rows and columns. The temporary storage device includes the same number of storage sites. In operation, photon generated charge packets are accumulated in the sensor during one time interval; and these charge packets are transferred from the sensor to the temporary storage during a second time interval. This charge transfer occurs in parallel from each column in the sensor. Phase electrodes overlie both the sensor and the temporary storage, and clocking signals are applied thereto in order to accomplish the charge transfer. Subsequently, another set of photon generated charge packets are accumulated in the sensor; while at the same time, the previously accumulated set of charge packets is read from the temporary storage device via the parallel-serial register to an output amplifier.

Another form of prior art charge coupled device imager is of the "interline transfer" type. This is described for example in U.S. Pat. No. 3,826,926 entitled, "Charge Coupled Device Area Imaging Array" which was issued to White et al on July 30, 1974. Basically, the interline transfer imager includes a plurality of photoelectric charge accumulation sites which are arranged in spaced apart columns. Lying within the spaces between the columns are respective parallel-serial charge coupled device registers. Each of these registers have inputs coupled to receive charge packets in parallel from the photoelectric charge accumulation sites, and has one output which couples to a respective input of another parallel-serial register. This other register lies parallel to the output end of the spaced apart parallel-serial registers. In operation, photon generated charge carriers are accumulated at the accumulation sites during one time interval; and subsequently these charge packets are transferred to the plurality of spaced apart parallel-serial registers. After this transfer, another set of charge packets are accumulated; while at the same time, the previously accumulated set of charge packets is read out via all of parallel-serial registers.

One problem with the above-described imager structures is that their physical implementation requires a relatively large amount of substrate space. In particular, the substrate space of the imager is approximately two times the space which is occupied by the photoelectric accumulation sites. This is because the prior art structures use approximately half the substrate space for image sensing, and use the other half of the substrate space for temporary storage of the sensed images. As a result, the total number of charge accumulation sites is substantially reduced over that which could be obtained if all of the substrate area were available for image sensing. And thus the resolution of the sensed picture is reduced accordingly.

Another problem with prior art imagers is that their structure does not enable two charge packets which are sequentially integrated in a particular charge accumulation site to be sequentially read out and compared. That is, in the above-described structures, the charge packets which are integrated during one time interval are all read out; and subsequently, the charge packets which are integrated next are all read out. Therefore, to compare the magnitude of successive charge packets from a particular element requires even greater amounts of storage and/or control circuitry. It is however, particularly useful to be able to perform this sequential readout and compare function. For example, in a moving target indicator, a difference in the magnitude of successively integrated charge packets from a particular picture element indicates movement of the target.

In view of these problems with the prior art, it is therefore one object of the invention to provide an improved charge coupled device imager.

It is another object of the invention to provide a charge coupled device imager wherein almost all of the substrate area can be used for image sensing.

It is another object of the invention to provide a charge coupled device imager wherein charge packets that are successively accumulated in each particular picture element may be sequentially read from the device.

It is still another object of the invention to provide a charge coupled device wherein the charge integration sites are stratified beneath the charge transfer channels.

SUMMARY OF THE INVENTION

These and other objectives are accomplished in accordance with the invention by a charge coupled device comprised of a semiconductor substrate having dopant atoms of a first type and a first surface. A plurality of parallel charge transfer channels lie spaced apart from each other in the substrate near the first surface. An insulating layer lies over the charge transfer channels and their separating regions. A plurality of phase electrodes are serially disposed on the insulating layer transversely to the all of the charge transfer channels. A barrier region lies in the substrate under and adjacent to all of the charge transfer channels and their separating regions. The barrier region has dopant atoms of the first type. A charge integration channel lies in the substrate under and adjacent to the barrier region. The charge integration channel has dopant atoms of a second type opposite to the first type. Interchannel charge transfer regions lie under selected portions of predetermined ones of the electrodes, with each selected portion respectively lying within only one channel. The electric potential within these regions varies by a relatively large degree when voltages are applied to the predetermined electrodes. This enables localized charge transfer from the charge integration region under the predetermined electrodes to the respective charge transfer channel in which the interchannel transfer regions lie.

BRIEF DESCRIPTION OF THE DRAWINGS

The novel features believed characteristic of the invention are set forth in the appended claims; the invention itself, however, as well as other features and advantages thereof, will best be understood by reference to the following detailed description of particular embodiments, read in conjunction with the accompanying drawings, wherein:

FIGS. 3a-3b are schematic diagrams illustrating the relative thicknesses and doping profile along a cross-section of the embodiments of FIGS. 1, 5, 8, 11 and 15;

FIG. 5 is a greatly enlarged cross-sectional view of a portion of a second embodiment of the invention;

FIG. 6 is a greatly enlarged top view of a portion of the second embodiment;

FIG. 7 is a timing diagram illustrating a set of voltages suitable for operating the second embodiment;

FIG. 10 is a timing diagram illustrating a set of voltages suitable for operating the third embodiment;

FIG. 11 is a greatly enlarged cross-sectional view of a portion of a fourth embodiment of the invention;

FIG. 12 is a greatly enlarged top view of a portion of the fourth embodiment;

FIG. 13 is a timing diagram illustrating a set of voltages suitable for operating the fourth embodiment;

FIG. 14 is a set of curves illustrating the potential at various points within the fourth embodiment;

DETAILED DESCRIPTION

Figure 1:
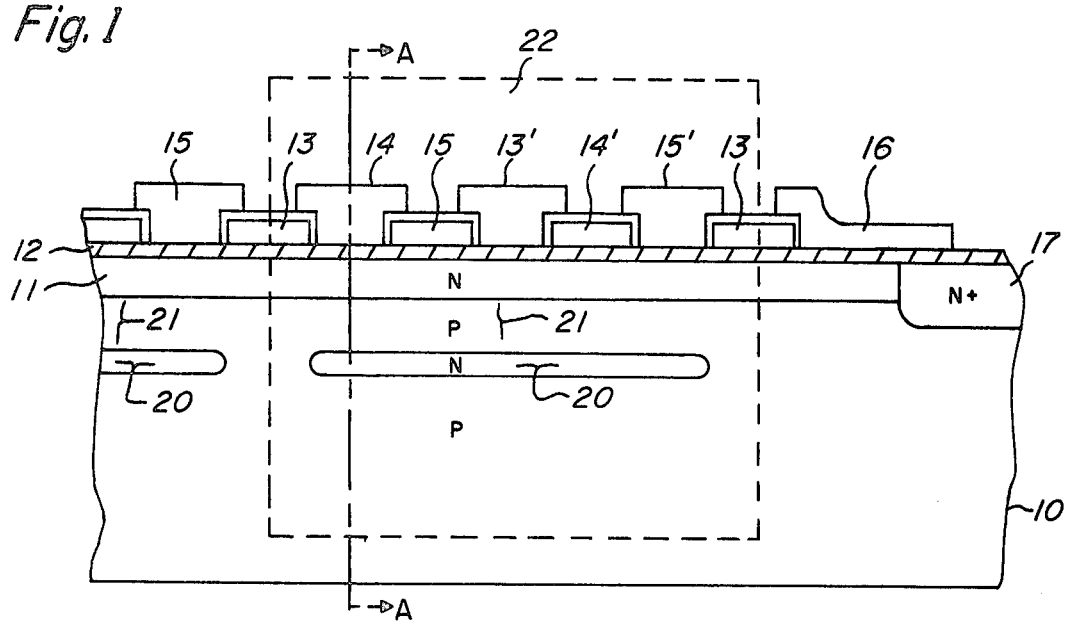
FIG. 1 is a greatly enlarged cross-sectional view of a portion of a first embodiment of the invention.
Figure 2:
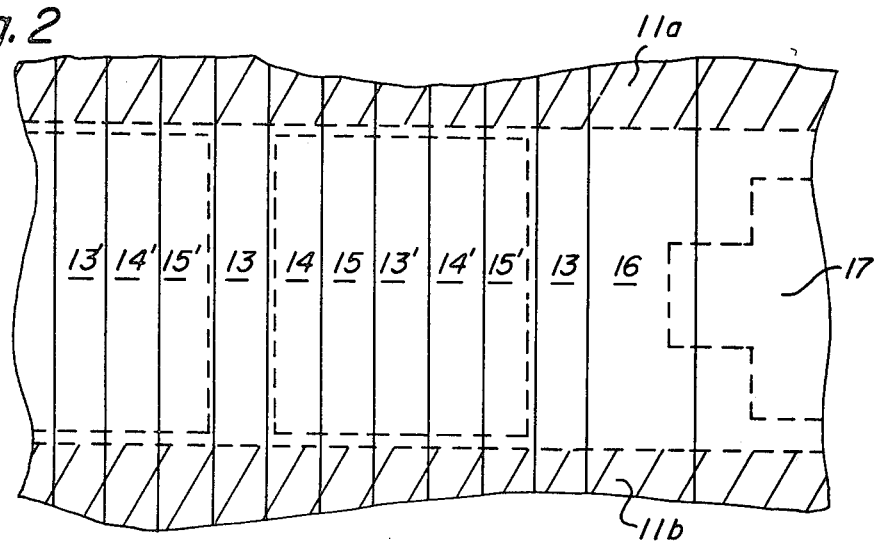
FIG. 2 is a greatly enlarged top view of a portion of the first embodiment.

A portion of a first embodiment of the invention is illustrated in FIGS. 1 and 2. The first embodiment includes a semiconductor substrate 10 having dopant atoms of a first type. These dopant atoms are indicated as being P-type in FIG. 1 as an example. A charge transfer channel 11 lies in substrate 10 near one surface thereof. An insulating layer 12 lies over charge transfer channel 11. A plurality of phase electrodes 13, 14, 15, 13', 14', and 15' are serially disposed on insulating layer 12 transversely to channel 11. At one end of channel 11, an output gate 16 lies next to one of the phase electrodes 13. A conventional, reverse-biased output diode 17 lies in substrate 10 adjacent to channel 11 partially under output gate 16.

Also included in the first embodiment are a plurality of charge integration regions 20. Regions 20 are serially spaced apart from each other in substrate 10 under charge transfer channel 11. Charge integration regions 20 have dopant atoms of a second type opposite to the first type. These atoms are indicated as being N-type in FIG. 1 as an example. A barrier region 21 lies in substrate 10 in a space between channel 11 and charge integration regions 20. Barrier region 21 has dopant atoms of the first type.

Each charge integration region 20 together with its overlying portion of barrier region 21, channel region 11, and phase electrodes form one picture element 22 of the invention. Preferably in the first embodiment, each of the charge integration regions 20 underlie five adjacent electrodes. Also preferably, regions 20 are spaced apart from each other by one phase electrode. This arrangement is illustrated in FIGS. 1 and 2. In those figures, picture element 22 may occupy 1.8 mils in the direction of charge transfer along channel 11; and channel 11 may be 1.8 mils wide as an example.

The first embodiment further includes channel stop regions 11a-11b, which define the perimeter of channel 11. In an imaging system constructed according to the first embodiment, a plurality of channels 11 lie parallel to each other near the surface of substrate 10; and they are separated from each other by channel stop regions such as 11a-11b. Each channel may or may not have its own output diode 17. Such an imaging system may suitably include, on a single semiconductor substrate, over one hundred channels 11 lying parallel to each other, with each channel including over one hundred picture elements 22.

A greatly enlarged cross sectional view of the structure of FIG. 1 taken through section lines A—A, along with the doping profile of each of the regions cut by section lines A—A is illustrated in FIGS. 3a and 3b. Reference numerals 10, 11, 12, 14, 20 and 21 indicate in FIG. 3a those portions of the FIG. 1 structure which are cut. These cut portions have respective thicknesses 31–35 as illustrated. Thicknesses 31–35, along with the doping profile of regions 10, 11, 20 and 21, may suitably be constructed in a variety of specific combinations. For example, a relatively large thickness 34 or relatively large peak charge density of charge integration region 20 may be utilized to increase the charge storage capacity of that region. As another example, a relatively large thickness 33 or relatively large peak charge density of region 21 may be utilized to improve photon penetration crosstalk between charge integration region 20 and charge transfer channel 11. Photon penetration crosstalk is herein defined as the ratio of photons falling incident to the backside of substrate 10 to those photons which penetrate through substrate 10, charge integration region 20, and barrier region 21 to generate charge carriers in buried channel 11.

In one specific version of the first embodiment, thickness 31 is 0.15 microns; thickness 32 is 0.75 microns; thickness 33 is 1.55 microns; thickness 34 is 0.40 microns; and thickness 35 is 12 microns. In this specific version, the dopant impurity charge density has a maximum value of $6.0 \times 10^{16}$ atoms per cm$^3$ in charge transfer channel 11, a maximum value of $1.0 \times 10^{16}$ atoms per cm$^3$ in barrier region 21, a maximum value of $8.0 \times 10^{16}$ atoms per cm$^3$ in charge integration region 20, and a maximum value of $1.0 \times 10^{16}$ atoms per cm$^3$ in substrate 10 underlying charge integration region 20.

Figure 4:
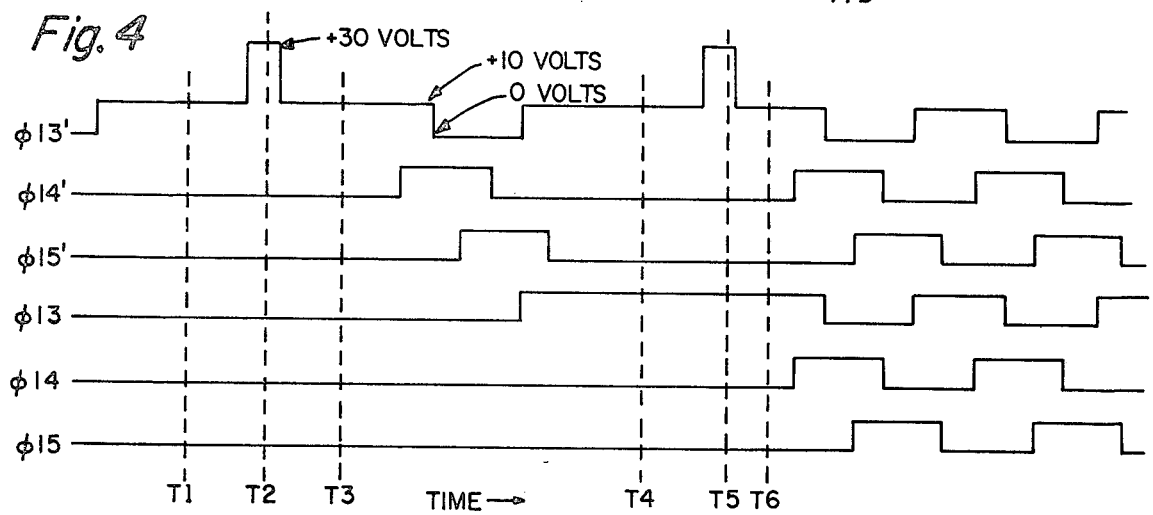
FIG. 4 is a timing diagram illustrating a set of voltages suitable for operating the first embodiment.

Referring now to FIG. 4, a timing diagram illustrating a voltage sequence for operating the structure of FIG. 1 is illustrated. In FIG. 5, voltages $\phi_{13}'$, $\phi_{14}'$, $\phi_{15}'$, $\phi_{13}$, $\phi_{14}$, and $\phi_{15}$ are respectively applied to electrodes 13', 14', 15', 13, 14, and 15. These voltages are generated by clocking means which have outputs coupled to the electrodes for generating first voltages to selected ones of the electrodes to enable charge transfer from charge integration regions 20 to the portion of charge transfer channel 11 underlying the selected electrodes, and for generating second voltages on all of the electrodes for propagating charge packets along charge transfer channel 20 toward output diode 17. In the example illustrated in FIG. 5, the first voltages are 30 volt pulses, and they are applied to phase electrodes 13'; while the second voltages are 0 volts and 10 volt pulses, and they are applied to all of the phase electrodes.

To begin, +10 volts is applied to electrodes 13' while 0 volts is applied to all of the other phase electrodes as indicated at time instant T1. This clocking condition enables photon generated electrons to be trapped in potential wells in charge integration regions 20 in potential wells 46 & 47 and to drift to potential wells underlying phase electrodes 13'. The clocking state indicated at time interval T1 typically lasts from 130 microseconds to 85 milliseconds, depending upon the intensity of the incident light. Subsequently, an interlevel charge transfer voltage (e.g., 30 volts) is applied to phase electrode 13' as indicated at time instant T2. In response thereto, charge transfers from potential wells in charge integration region 20 under electrodes 13' to potential wells in channel 11 under phase electrodes 13'. This is a relatively rapid charge transfer, and typically it is complete within approximately 1 microsecond.

Subsequently, the voltage on phase electrodes 13 is returned to 10 volts and the clocking state as indicated at time T3 is entered. In this T3 clocking state, photon generated electrons are again trapped in potential wells in charge integration regions 20. And, at the same time, the previously transferred charge packets are held in potential wells in channel 11 under electrodes 13'. Again, the clocking state indicated at time T3 typically lasts from 130 microseconds to 85 milliseconds.

Subsequent to the T3 clocking state, a clocking sequence is applied to the phase electrodes which propagates the charge packets in channel 11 from under phase electrodes 13' to under phase electrodes 13. This clocking sequence is indicated in FIG. 4 by the waveforms between time instant T3 and time instant T4. The clocking sequence indicated therein also cause the potential wells within charge integration region 20 to move from under one electrode to another. However, the charge packets in one charge integration region 20 do not comingle with the charge packets in another charge integration region 20, since all of the charge integration regions 20 are spaced apart from each other. Thus the charge packets within one charge integration region 20 simply "slosh" back and forth in that region in response to the voltage sequence between T3 and T4. And at the time instant T4, the charge packets in charge integration regions 20 underlie phase electrodes 13'; while the charge packets in channel 11 underlie phase electrodes 13.

At a later time instant T5, an interlevel transfer voltage is applied to phase electrode 13'. In response thereto, charge packets are transferred from charge integration regions 20 to charge transfer channel 11 under phase electrodes 13'. Subsequently as indicated at the time instant T6, the voltage on phase electrodes 13' is reduced to 10 volts. Thereafter, the voltages on all of the phase electrodes are sequenced in a three phase relationship as indicated in FIG. 4 to propagate all of the charge packets along channel 11 to output diode 17.

By utilizing the above described voltage sequence, output diode 17 sequentially receives two charge packets from each one of the particular picture elements 22. The first charge packet which diode 17 receives is a measure of the photons accumulated generally about the time instant T1, while the second charge packet is a measure of the photons accumulated generally about the time instant T3. Thus this structure and read out sequence is particularly useful as a moving target indictor. There, a difference in magnitude between successive charge packets from one picture element 22 indicates movement of the target.

Referring now to FIG. 5, a greatly enlarged cross sectional view of a second embodiment of the invention is illustrated. The second embodiment is comprised of a semiconductor substrate 60 having dopant atoms of a first type and having a first surface. A charge transfer channel 61 lies in substrate 60 near the first surface; and an insulating layer 62 lies over channel 61. A plurality of phase electrodes 63, 64 and 65 lie on insulating layer 62 serially disposed transversely to channel 61. At an output end of channel 61, a transfer gate electrode 66 lies on insulating layer 62 next to the last phase electrode 63. A conventional, reverse-biased output diode 67 lies in substrate 60 spaced apart from the last phase electrode 63 and partially underlying transfer gate electrode 66.

Also included in the second embodiment are a plurality of spaced apart charge integration regions 70. Regions 70 lie in substrate 60 beneath charge transfer channel 61. A barrier region 71 separates each charge integration region 70 from charge transfer channel 61. Each of the charge integration regions 70 underlie only two adjacent phase electrodes. This is indicated in FIG. 5 wherein each charge integration region 70 underlies a pair of the phase electrodes 64 and 65 as an example. Regions 70 are spaced apart by the substrate area underlying the phase electrodes 63. Accordingly, each picture element 72 occupies an area underlying only three phase electrodes. The second embodiment further includes clocking means coupled to electrode 63–65 for applying first voltages to every third electrode and second voltages to all of the electrodes. The first voltages enable charge transfer from charge integration regions 70 to the portions of charge transfer channel 61 underlying every third electrode; while the second voltages enable charge propagation along channel 61. In this respect, the previous description made in conjunction with FIGS. 3a, and 3b also apply to the cross section A—A of FIG. 7.

A top view of the second embodiment is illustrated in FIG. 6. Reference numerals 63–65 indicate the plurality of phase electrodes lying transversely to channel 61; while reference numerals 70 indicate the plurality of charge integration regions lying under phase electrodes 64 and 65. Channel stop regions 61a and 61b define the parameter of channel 61. Suitably, channel 61 is 0.9 mils wide; while channel stop regions 61a and 61b are 0.25 mils wide as an example. Utilizing these dimensions, an imager having picture elements constructed according to FIGS. 7 and 6 may be built on a single semiconductor substrate to include one hundred charge transfer channels with each channel including one hundred and sixty picture elements as an example.

The operation of the second embodiment is illustrated in FIG. 7. Voltage waveforms $\phi_{63}$, $\phi_{64}$, and $\phi_{65}$ are applied respectively to electrodes 63, 64, and 65. These voltage waveforms illustrate an overlap mode of operation wherein one set of charge packets are propagated along charge transfer channels 61 and read out via diode 67, while at the same time, a second set of charge packets are accumulated in charge integration regions 70. Specifically, at a time instant $T_{10}$, the first voltage (suitably 30 volts) is applied to electrode 65 while zero volts is applied to electrodes 63 and 64. In response thereto, charge packets are transferred from charge integration regions 70 to potential wells in channel 61 underlying phase electrodes 65.

Subsequently, a sequence of second clocking voltages are applied to phase electrodes 63–65 to propagate the charge packets from under electrodes 65 to the output end of the channel 61. These voltages may suitably be zero volts and +10 volts. At the same time, the application of zero volts and +10 volts to phase electrodes 63–65 causes potential wells in charge integration regions 70. Accordingly, charges accumulate in regions 70 during the entire read out sequence. These charges are not co-mingled since the charge integration regions 70 are spaced apart from each other. Subsequently after all of the charge packets in channel 61 have been propagated to output diode 67, the first clock voltage (such as 30 volts) is again applied to phase electrodes 65 to enable transfer of charge from regions 70 to channel 61. This is indicated at time $T_{11}$ in FIG. 7. After the transfer of charge from regions 70 to channel 61 is complete, the above described cycle repeats. This overlap mode of operation is particularly useful in a camera, where after one picture frame is read out, another frame is immediately ready for read out.

Figure 8:
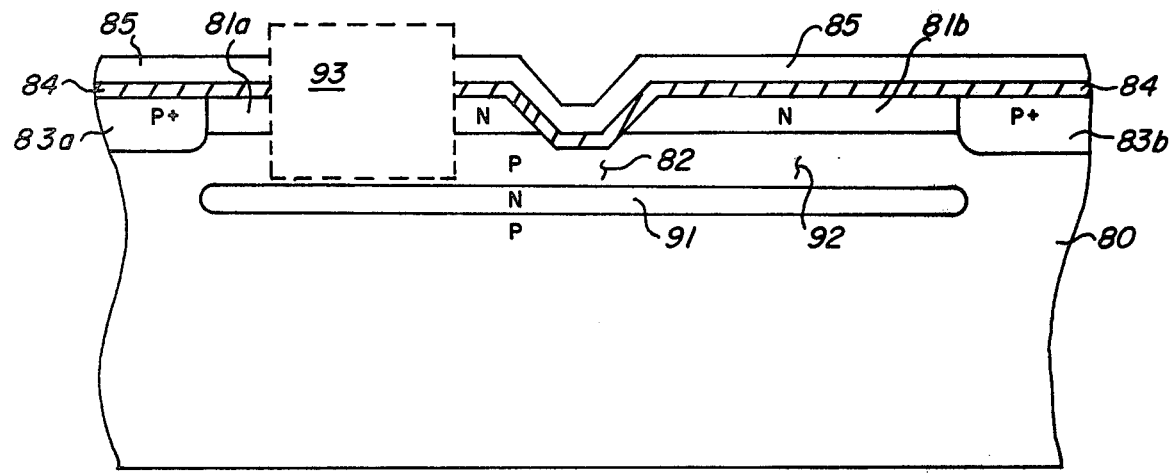
FIG. 8 is a greatly enlarged cross-sectional view of a portion of a third embodiment of the invention.
Figure 9:
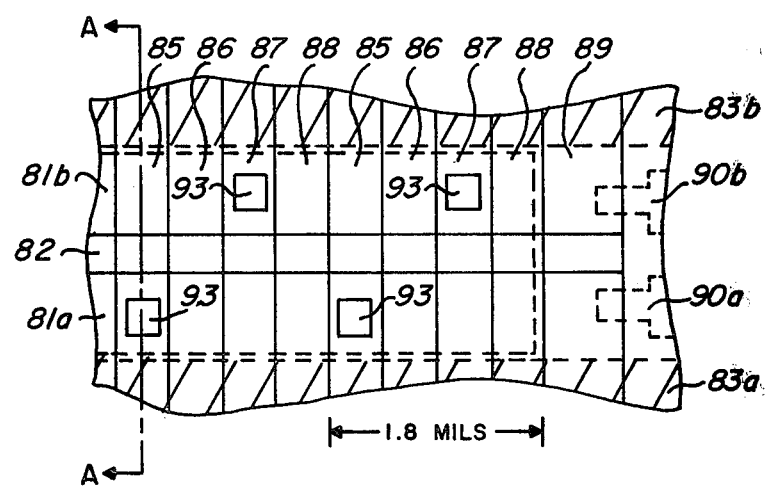
FIG. 9 is a greatly enlarged top view of a portion of the third embodiment.

A third embodiment of the invention will now be described in conjunction with FIGS. 8 and 9. FIG. 8 is a cross section taken along section lines A—A of FIG. 9. Functionally, the third embodiment differs from those described above in that it has a read out format wherein charges from successive integration periods are read out in parallel. Included within the third embodiment is a semiconductor substrate 80 having dopant atoms of a first type. Substrate 80 has a first surface and, in general, a plurality of parallel spaced apart charge transfer channels lie therein. The specific version of the third embodiment illustrated in FIGS. 8 and 9 has two such parallel charge transfer channels 81a and 81b. Preferably, channels 81a and 81b are buried channels. These are indicated in FIG. 8 as being N-type as an example. A separating region 82 lies between channels 81a and 81b; while channel stop regions 83a and 83b lie in substrate 80 near the first surface to define the lateral perimeter of channels 81a and 81b. An insulating layer 84 lies on top of channels 81a and 81b and on top of channel separating region 82. A plurality of phase electrodes 85–88 are serially disposed on insulating layer 84 transversely to all of the charge transfer channels. An output gate electrode 89 lies next to the last phase electrode 88 at the output end of channels 81a and 81b. Conventional, reverse-biased output diodes 90a and 90b respectively lie in substrate 80 spaced apart from channels 81a and 81b and partially underlie output gate electrode 89.

Also included in the third embodiment is a charge integration channel 91 and a barrier region 92. Barrier region 92 lies in substrate 80 under charge transfer channels 81a and 81b and under channel separating region 82. Charge integration channel 91 lies in substrate 80 under barrier region 92. Integration channel 91 has dopant atoms of a second type opposite to the first type; while barrier region 92 has dopant atoms of the first type.

The third embodiment further includes a plurality of interchannel transfer means 93. In general, these interchannel transfer means 93 vary the potential under selected portions of predetermined ones of the phase electrodes by a relatively large degree in comparison to the potential under the remaining portions of the predetermined electrodes. In the specific version of the third embodiment illustrated in FIGS. 8 and 9, electrodes 85 and 87 are the predetermined electrodes; and the selected portions of these electrodes respectively overlie channels 81a and 81b.

In operation, clocking signals are applied to phase electrodes 85–88 in a sequence whereby charge carriers are integrated in charge integration channel 91 under the electrodes of one phase. Subsequently these charge packets are transferred via interchannel transfer means 93 to one of the parallel charge transfer channels 81a or 81b. Then the cycle repeats but the charge packets are transferred to the other parallel charge transfer channel. Following this, the charge packets are propagated along charge transfer channels 81a and 81b for sensing by output diodes 90a and 90b respectively. FIG. 10 is a timing diagram illustrating one such suitable sequence. In FIG. 10, voltage $\phi 85$–$\phi 88$ are applied respectively to electrodes 85–88. To begin, a voltage of 10 volts is applied to phase electrode 86; while 0 volts are applied to phase electrodes 85, 87, and 88. In this voltage state, which is indicated at time instant $T_{20}$, charge carriers generated by photons falling incident to the backside of substrate 80 are integrated in potential wells under electrode 86 in charge integration region 91. This voltage state lasts for a relatively long period of time as was previously described in conjunction with the first and second embodiments. Subsequently, the voltages on electrodes 85-88 are sequenced as indicated in FIG. 10 by the timing instance T21-T23. By this sequence, the charge packets are transferred first from potential wells in charge integration region 91 under electrodes 86 to potential wells in charge integration region 91 under electrodes 85, and then to potential wells in charge transfer channel 81a under phase electrode 85.

Subsequently the voltages on the phase electrodes 85-88 are sequenced as indicated by the timing instance T24-T26. This voltage sequence moves the previously integrated charge packets from the potential well in charge transfer channel 81a under phase electrode 85 to potential wells in charge transfer channel 81a under phase electrodes 86. Also, the voltage state indicated at time instant T26 operates to enable photon generated charge carriers to be integrated in charge integration channel 91 under phase electrode 86. Again, the voltage state indicated at time instant T26 lasts for a relatively long period time.

Following this, the voltage sequence indicated by timing instance T27-T29 is applied to phase electrodes 85-88. This sequence moves the charge packets which were integrated at T26 from potential wells in charge integration region 91 under phase electrodes 86 to potential wells in charge transfer channel 81b under phase electrodes 87. At the same time, this voltage sequence moves the charge packets which resided at timing instant T26 under phase electrodes 86 in charge transfer channel 81a to potential wells under phase electrodes 87 in charge transfer channel 81a. The remaining voltage sequence indicated in FIG. 10 operates to propagate these charge packets in parallel along charge transfer channels 81a and 81b toward output diodes 90a and 90b respectively.

Still another embodiment of the invention, the fourth embodiment, is illustrated in FIG. 11. The fourth embodiment is comprised of a semiconductor substrate 100. Charge transfer channels 101a and 101b lie in substrate 100 near one surface thereof. Channels 101a and 101b are parallel to said spaced apart from each other. A control electrode 102 lies in the space between channels 101a and 101b. Electrode 102 functions as a selective channel stop for channels 101a and 101b. An insulating layer 103 lies over channels 101a and 101b. Insulating layer 103 also surrounds control electrode 102 thereby separating electrode 102 from channels 101a and 101b. Channel stop regions 104a and 104b define the lateral perimeter of channels 101a and 101b respectively.

In general, the fourth embodiment also includes a plurality of phase electrodes serially disposed over and lying traversely to channels 101a and 101b. Selected portions of predetermined ones of these phase electrodes are electrically separable from the remaining portions such that separate clocking signals may be applied thereto. The specific version of the fourth embodiment illustrated in FIGS. 11 and 12 is a two-phase version, and includes electrodes 105 and 106 having phases $\phi 1$ and $\phi 2$ respectively. Phase electrode 105 is split into portions 105a and 105b which respectively overly channels 101a and 101b. Separate clocking signals $\phi_1 A$ and $\phi_1 B$ may be applied respectively to split electrode portions 105a and 105b.

Also included in the fourth embodiment is a charge integration region 107 and a barrier region 108. Barrier region 108 lies beneath channels 101a and 101b, and beneath control electrode 102; while charge integration region 107 lies beneath and adjacent to barrier region 108. In general, barrier region 108 and substrate 100 include dopant impurity atoms of one type, while charge transfer channels 101a, 101b and charge integration region 107 include dopant atoms of the second type opposite to the first type. A suitable doping profile for each of these regions along with their relative thicknesses taken through section lines A—A and B—B has been described in conjunction with FIGS. 3a and 3b.

FIG. 13 is a set of curves 110-113 illustrating a sequence of voltages suitable for application to the electrodes of the fourth embodiment for operation thereof. Specifically, voltages $\phi_1 A$, $\phi_1 B$, $\phi 2$ and $\phi T$ are applied respectively to electrodes 105a, 105b, 106 and 102. The voltages indicated at time instant $T_{40}$ are utilized to integrate charge in the charge integration region 107 under the phase electrodes 105 and to transfer this charge from the charge integration region 107 to potential wells in charge transfer channel 101a lying under phase electrode 105a. FIG. 14 contains curves illustrating the electric potential at various points under phase electrodes 105 under the clocking conditions of time T40. Specifically, a curve 120 indicates the potential in charge integration region 107 beneath phase electrode 105; while a curve 121 indicates the potential in channel 101a beneath phase electrode 105a. As therein indicated, the voltage conditions of time instant T40 generates a potential gradient in charge integration region 107 which enables charge carriers to accumulate beneath phase electrodes 105 and to drift to channel 101a beneath phase electrode 105a. The voltage state of time instant T40 also generates a potential well in channel 101b as indicated by a curve 122 in FIG. 14. However, charge carriers which accumulate in charge integration region 107 do not diffuse to this potential well since a potential barrier exists in barrier region 108 as indicated by curve 123 in FIG. 14.

Subsequent to the integration and transfer of charge to channel 101a, the voltage sequence indicated at time instants T41 and T42 occurs. Under the voltage state of time instant T42, charge carriers are integrated in charge integration region 107 and drift to potential wells in channel 101b under electrode 105b. The potential during this voltage state at various points under electrodes 105a and 105b is similer to that described above—the difference being that curves 120-123 should be flip-flopped to reflect deeper potential wells under phase electrodes 105b than under electrodes 105a. Following this charge integration sequence, the charge packets in channels 101a and 101b are propagated in parallel along their respective channels toward an output end for read out. The two-phase voltage sequence indicated at time instants T45-T47 is suitable for this purpose.

A fifth embodiment of the invention will now be described in conjunction with FIGS. 15 and 16. In general, some of the portions of the fifth embodiment are similar to those previously described in conjunction with FIGS. 5 and 6. Reference numerals 61-67 indicate the similar portions. In addition, the fifth embodiment includes a charge integration channel 130 which lies in substrate 60 beneath charge transfer channel 61. That is, charge integration channel 130 is continuous and underlies the entire charge transfer channel 61. A barrier region 131 lies between charge integration channel 130 and charge transfer channel 61. Clocking means couple to electrodes 63-65 for applying first voltages to selected ones of the electrodes to enable the transfer of charge packets from charge integration channel 130 to charge transfer channel 61, and for applying second voltages on all of electrodes 63–65 to enable propagation of charge packets simultaneously along both charge transfer channel 61 and charge integration channel 130 in a piggyback fashion to respective output ends of the channels.

Also included in the fifth embodiment at the output end of channels 61 and 130 is a separation stage 140 for detecting charge packets propagated thereto in channels 61 and 130. Charge separation stage 140 includes two sets A and B of controlled electrodes 141–143 serially disposed on insulating layer 62 between the last phase electrode 65 and output gate 66. A portion 61A of charge transfer channel 61 lies beneath both sets of control electrodes 141–143. Also, a portion 131A of barrier region 131 lies beneath charge transfer channel portion 61A; and a portion 130A of charge transfer channel 130 extends under the first four control electrodes.

Figure 15:
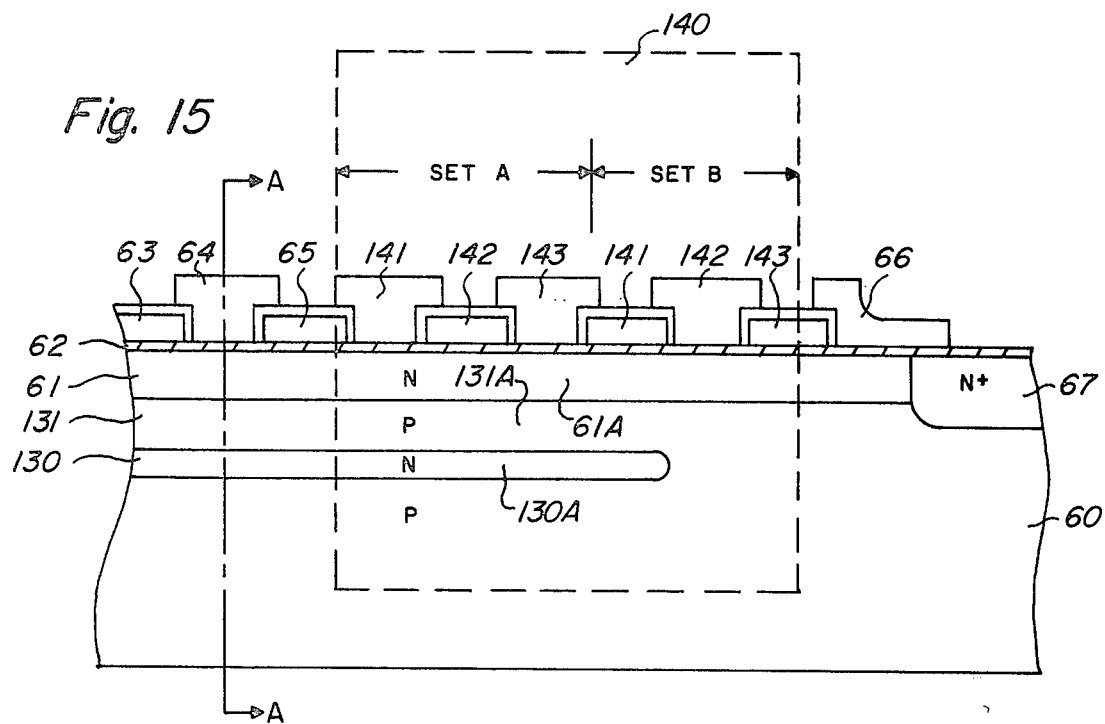
FIG. 15 is a greatly enlarged cross-sectional view of a portion of a fifth embodiment of the invention.
Figure 16:
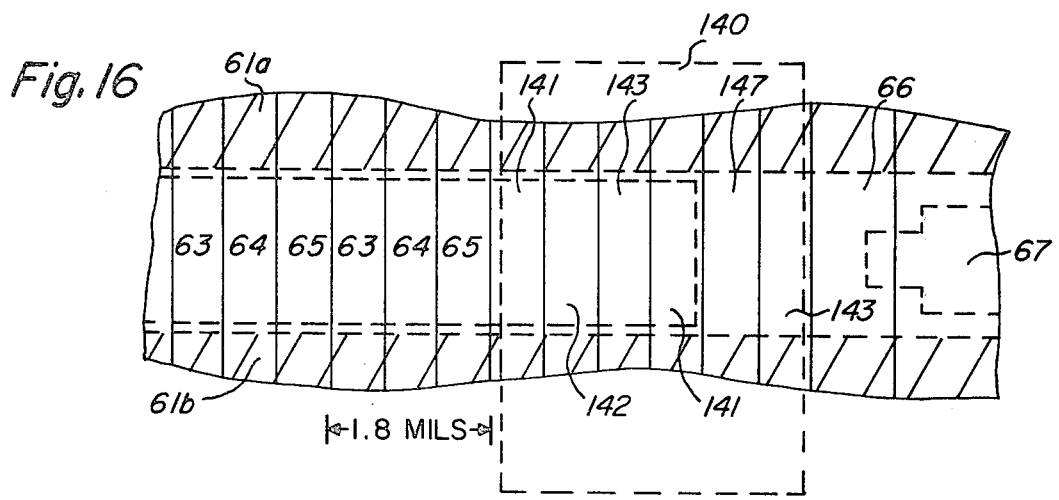
FIG. 16 is a greatly enlarged top view of a portion of the fifth embodiment.
Figure 17:
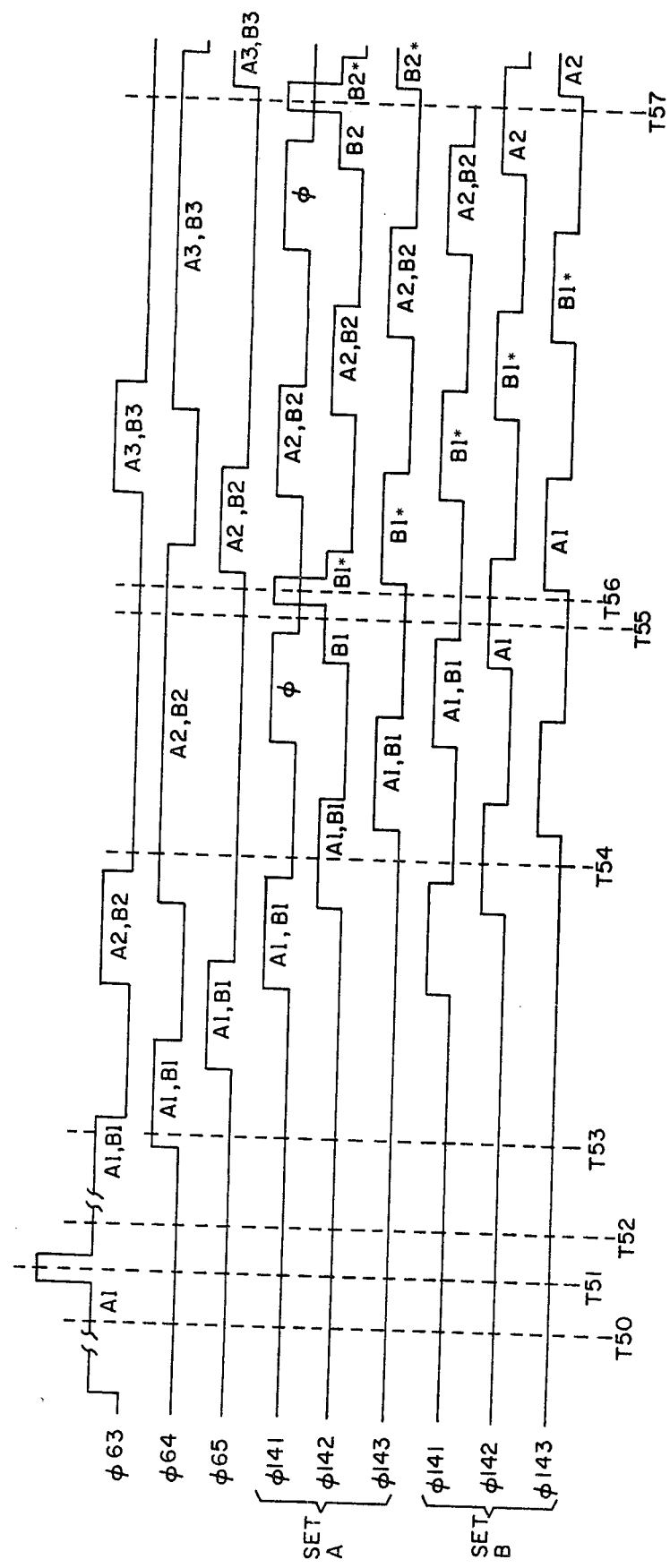
FIG. 17 is a timing diagram illustrating voltages suitable for operating the fifth embodiment.

A clocking sequence suitable for operating the fifth embodiment of FIGS. 15 and 16 is illustrated in FIG. 17. Voltage waveforms $\phi_{63}$–$\phi_{65}$ and $\phi_{141}$–$\phi_{143}$ are applied respectively to electrodes 63–65 and electrodes 141–143. At a time instant T50, +10 volts is applied to electrodes 63 while 0 volts are applied to the remaining electrodes. In this voltage state, photon generated charge carriers are integrated in charge integration channel 130 in potential wells beneath electrodes 63. After a suitably long integration period, a relatively large voltage (e.g. 30 volts) is applied to phase electrodes 63 as indicated at time instant T51. In response thereto, the previously integrated carrier charge packets drift to potential wells 52 in charge transfer channel 61 beneath phase electrodes 63. Subsequently, the voltage on phase electrodes 63 is returned to +10 volts as indicated at time instant T52. In this voltage state, photon generated carrier charge packets again accumulate in charge integration regon 130 at poetntial wells beneath phase electrodes 63; while the previously integrated charge carriers are stored in potential wells under electrodes 63. Thus, after a suitably long charge integration period, charge packets exists in both channels 61 and 131 beneath phase electrodes 63.

The remaining clocking sequence illustrated in FIG. 17 operates to enable charge packets to be read alternately from charge transfer channel 61 and charge integration channel 130. During the voltage sequence between time instants T53 and T54, a charge packet in channel 61 under the last phase electrode 64 is propagated to lie in channel 61 under the first control electrode 142. This charge packet is indicated in FIG. 17 via the symbol A1. Simultaneously, the clocking sequence between time instants T53 and T54 propagates a charge packet along charge integration channel 130 from under the last phase electrode 64 to under the first control electrode 142. This charge packet is indicated in FIG. 17 via the symbol B1. Also in FIG. 20, symbol B1* indicates this charge packet after it has been transferred to charge transfer channel 61. Similarly, the symbols A1, A3, . . . represent the second, third, . . . charge packets in channel 61; while the symbols B2, B3, . . . represent the second, third, . . . charge packets in channel 130.

The clocking sequence immediately following the time instant T54 operates to enable charge packet A1 and B1 to be sequentialy read via output gate 66 and output diode 67. During this sequence, the voltages on electrodes 63, 64 and 65 are frozen at their T54 state. Thus, charge packets A2, B2, etc. which follow charge packets A1 and B1 remain under phase electrodes 64 while charge packets A1 and B1 are detected. This detection is accomplished by first separating charge packets A1 and B1 such that they do not lie beneath the same phase electrode. The clocking sequence between time instant T54 and T55 performs the lateral separation. And at time instant T55 charge packet A1 lies beneath the set B control electrode 142, while charge packet B1 lies beneath the set A control electrode 142. This lateral separation occurs in response to the indicated clocking sequence because portion 130A of charge integration channel 130 does not extend underneath all of the control electrodes of the second set.

After charge packets A1 and B1 are laterally separated, charge packet B1 is transferred from region 130A to charge transfer channel 61A by application of an appropriately large voltage to one of the control electrodes. For example, a voltage of +30 volts may be applied to the set A control electrode 142 as indicated at time instant T56. The charge packets A1 and B1 are propagated serially down channel portion 61a for detection via diode 67. Subsequently to time instant T56, the voltage sequence indicated in FIG. 17 between T56 and T57 is repeated until all the charge packets in channel 61 and 130 are propagated in piggyback fashion to output diode 67 for detection.

Figure 18:
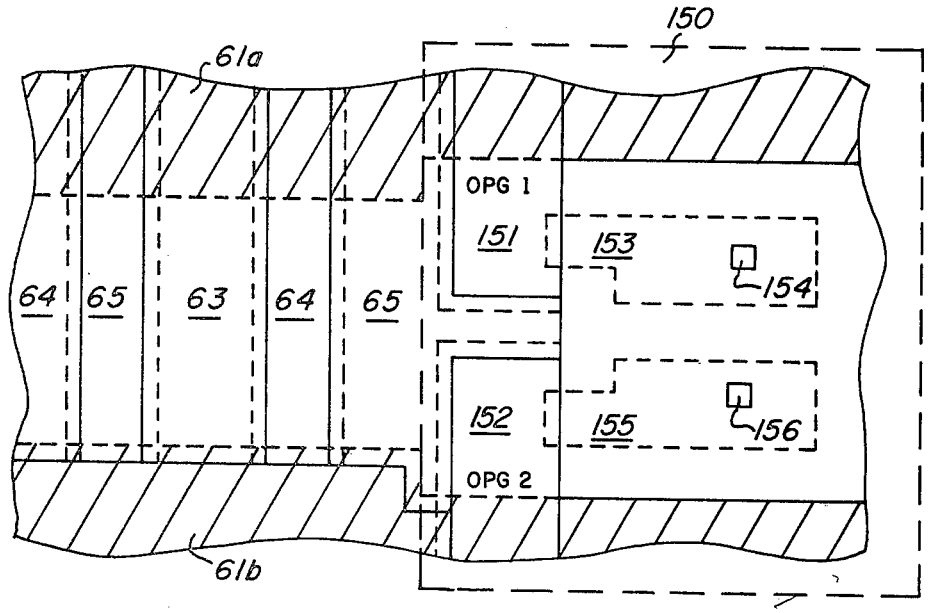
FIG. 18 is a greatly enlarged top view of a portion of a sixth embodiment of the invention.
Figure 19:
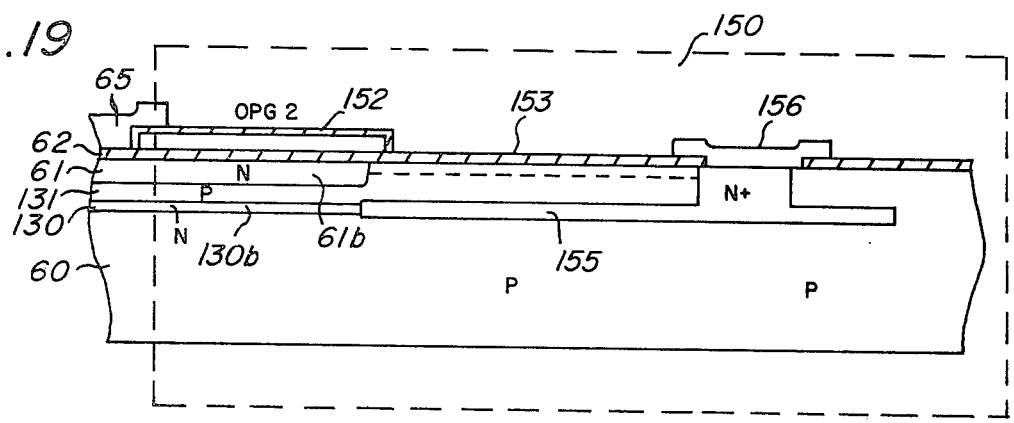
FIG. 19 is a greatly enlarged cross-sectional view of a portion of the sixth embodiment.

Referring now to FIGS. 18 and 19, a sixth embodiment of the invention will be described. The sixth embodiment is similar to the fifth embodiment in that both have a piggyback form of read out. Some parts of the sixth embodiment are also similar in structure to the fifth embodiment; and these similar portions are indicated via reference numerals 60–65 and 130–131. Also included in the sixth embodiment is a piggyback charge detection means 150. Detector 150 includes output gates 151 and 152. Gate electrodes 151 and 152 lie on insulating layer 62 adjacent to respective portions of the last phase electrode 65 at the output end of channels 61 and 130. A portion 61B of charge transfer channel 61 extends under output gate electrode 151; while a portion 130B of charge integration channel 130 extends under output gate electrode 152. A conventional, reverse-biased output diode 153 having a metal contact 154 lies in substrate 60 partially under output gate 151 and connected to portion 61b of transfer channel 61. Similarly, another conventional, reverse-biased output diode 155 having a metal contact 156 lies in substrate 60 partially under output gate 152 and in contact with portion 130B of charge integration 130.

By utilizing charge detector 150, the clocking sequence required for operation is considerably simplified in comparison with the previously described sequence of FIG. 17. To begin, the clocking sequence indicated by time instants T50–T53 are repeated in order to accumulate photon generated charge carriers under phase electrodes 63 in both the charge transfer channel 61 and charge integration 130. Subsequent thereto, three phase clocking signals are sequentially applied to phase electrodes 63–65 in order to propagate the accumulated charge packets toward output diodes 153 and 154. Control signals, which may be either D.C. bias voltages or sequential clock voltages, are applied to output gates 151 and 152 in parallel. These enable the charge packets to be read from under the last phase electrode 65 via diodes 153 and 155 respectively without freezing the three phase clocks.

An alternative version of the sixth embodiment has all of the above described structure of FIGS. 18 and 19 with the exception that diodes 153 and 155 are coupled together to form a single diode. In this embodiment, charge detection is accomplished by sequentially applying control pulses to output gates 151 and 152 to sequentially detect charge from charge transfer channel 61 and charge integration channel 130 respectively. A piggyback charge detector of this architecture may be preferred when it is desirable to time share the output circuitry coupled to metal contact 154. Such time sharing saves substrate space and ensures uniform dynamic operational characteristics as an example.

Figure 20:
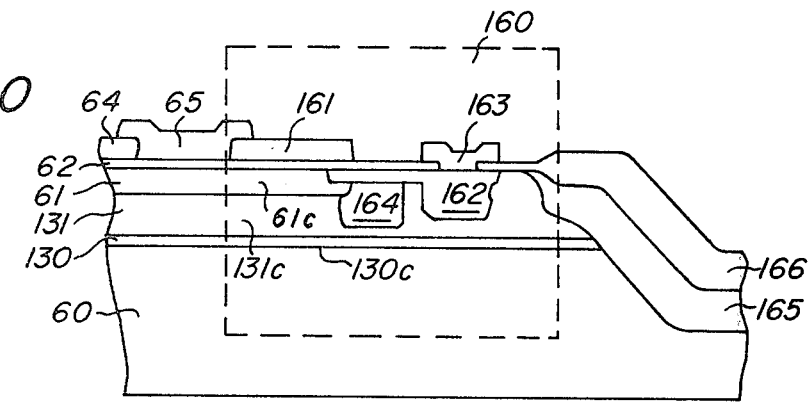
FIG. 20 is a greatly enlarged cross sectional view of a portion of a seventh embodiment of the invention.

Still another embodiment of the invention, the seventh embodiment, is illustrated in FIG. 20. The seventh embodiment is similar in structure to the above described fifth and sixth embodiments; and reference numerals 60–65 and 130–131 indicate those parts having a similar structure. The seventh embodiment includes a piggyback output charge detector 160 which differs in structure from those described above. Charge detector 160 includes a single output gate electrode 161 lying on insulating layer 62 adjacent to the last phase electrode 65 at the output end of channel 61 in 130. A single conventional, reverse-biased output diode 162 having a metal contact 163 lies in substrate 60 partially underlying output gate 161. A portion 61c of charge transfer channel 61 extends under output gate 161 and makes contact with output diodes 162. In addition, a portion 130c of charge integration channel 130 extends under and is spaced apart from both output gate 161 and output diode 162. A doped region 164 with atoms of the first type opposite to the second type lies in the substrate directly under a portion of diode 162 between output gate 161 and metal contact 163.

An important aspect of this embodiment is that integration channel 130 may be formed without a selective deposition. As a result, the embodiment is relatively easy to construct. Preferably, channel 130 and barrier region 131 are epitaxial grown layers. These may be grown in a continuous chemical vapor deposition reactor as an example. Subsequently, etched channel stop regions 165 and field oxide regions 166 are formed to define channel 130.

In operation, charge packets lying in charge transfer channel 61 under phase electrode 65 are first detected, and subsequently charge packets lying in charge integration channel 130 under phase electrode 65 are detected. Specifically, a control voltage is applied to gate electrode 161 to enable charge transfer from channel 61 into diode region 162. This control voltage also generates a potential well in charge integration channel 130C under control gate 161. But doped region 164 produces a potential barrier in charge integration channel 130c directly under region 164; and therefore, charge packets in charge integration channel 130c do not propagate past the barrier region 164. Subsequently, a relatively large voltage is applied to phase electrode 65 to enable charge transfer from charge integration region 130c to charge transfer channel 61. After this interchannel charge transfer, the charge packets in channel 61 are detected by the sequence as described above.

Figure 21:
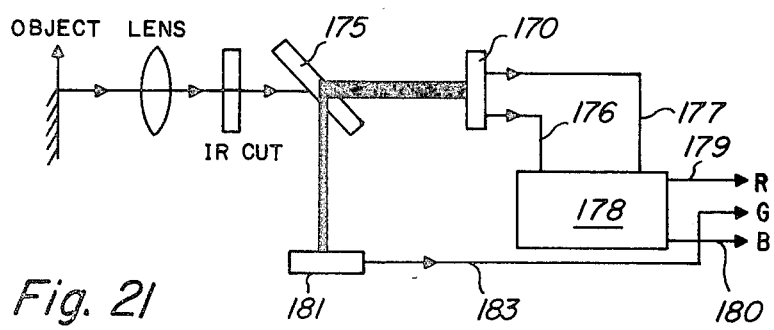
FIG. 21 is a schematic diagram of a color camera which incorporates either the fifth, sixth or seventh embodiments of the invention.
Figure 22:
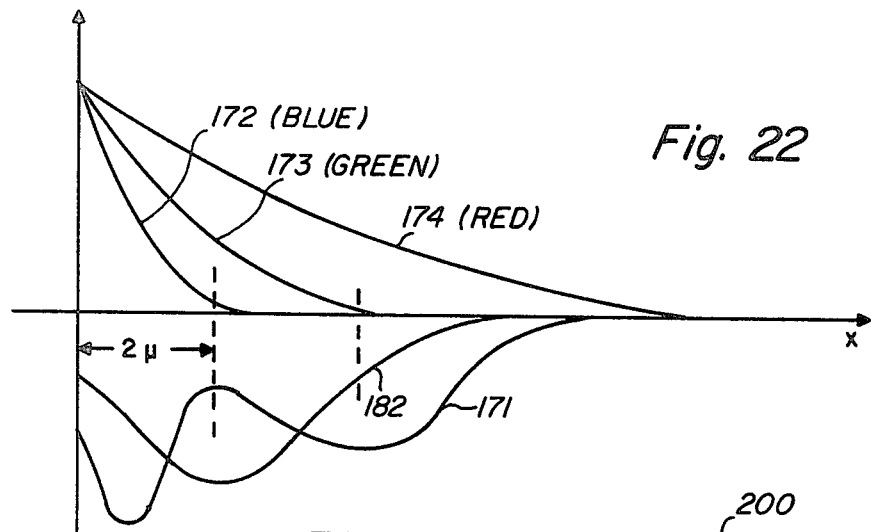
FIG. 22 is a set of curves indicating the potential at various points in the imager used by the color camera of FIG. 21.

The above described fifth, sixth and seventh embodiments of the invention may be utilized to construct a color imager as well as a black and white imager. A camera which utilizes one such a color imager 170 is illustrated in FIG. 21. In imager 170, charge transfer channels 61 and charge integration channels 130 respectively accumulate carrier charge packets generated by photons of a particular wavelength range corresponding to particular colors. To this end, imager 170 is front side illuminated. Charge transfer channel 61 and charge integration channel 130 within imager 170 are separated by a potential barrier having a maximum at approximately 2 microns beneath insulating layer 62. The exact position of the well minimums which lie on either side of this barrier is actively unimportant since all carriers formed on the sides of the barrier will drift away from the barrier to the respective wells. These potential well and barriers are illustrated in FIG. 22 via a curve 171. The distance of 2 microns is physically implemented by constructing transfer channels 61, barrier regions 131, and charge integration channels 130 with appropriate thicknesses and doping profiles.

Also, illustrated in FIG. 22 are curves 172–174 which indicate the rate at which carrier charge packets are generated in regions 61, 131, and 130 in response to light of various wavelengths falling incident to the front surface of imager 170. In particular, curves 172, 173, 174 respectively indicate the charge carrier generation rate for blue light, green light, and red light. It can be seen from FIG. 22, that charge integration channel 130 accumulates approximately 40% of the charge carries generated by red light, and 5% of the charge carries generated by blue light. Similarly, charge transfer channel 61 will accumulate approximately 95% of the charge carriers generated by blue light plus approximately 60% of the charge carriers generated by red light. Charge carries generated by green light can be ignored since the camera of FIG. 21 includes a dichroic mirror 175 which filters green light from the light which falls incident to imager 170.

Imager 170 also has an output 176 from charge integration channel 130, and the magnitude of signals generated thereon are proportional to 40% of the intensity of red light which imager 170 receives plus 5% of the intensity of the blue light it receives. Similarly, device 170 has another output 177 from charge transfer channel 61, and the magnitude of signals generated thereon are proportional to the intensity of 95% of the blue light plus 60% of the red light which image 170 receives. Outputs 176 and 177 couple to a conversion circuit means 178. Circuit means 178 performs an inverse transform of the signals on outputs 176 and 177 to generate signals R and B on output 179 and 180 respectively proportional to the intensity of the red light and blue light which imager 170 receives.

Also included in the color camera of FIG. 21 is a second imager 181. Device 181 receives the green light which is filtered by mirror 175. Included within imager 181 are buried channels having a potentials beneath its insulating layer as indicated in FIG. 21 via curve 182. The exact position of the well minimum is unimportant since all carries are formed by light of only one color, and will drift to the well. In operation, imager 181 accumulates charge carriers in its potential wells which are generated by the green light that it receives. Imager 181 has an output 183 and signals generated thereon have a magnitude proportional to the intensity of this green light.

An eighth embodiment of the invention will now be described in conjunction with FIG. 23. The eighth embodiment is similar in structure to the fifth embodiment which was previously described in conjunction with FIG. 15. Reference numerals 60–67 and 130–131 indicate the similar portions. Also included in the eighth embodiment is a second charge integration channel 190 and a second barrier region 191. Channel 190 lies beneath and is spaced apart from channel 130; while the second barrier region 191 lies in the space between channels 190 and 130.

Also included in the eighth embodiment is an output stage 200 which lies at the output end of channels 61, 130, and 190. Stage 200 operates to laterally separate charge packets received from these three channels. Stage 200 includes three sets of control electrodes 210-203. Electrodes 210-203 are serially disposed on insulating layer 62 and lie traversely to channel 61 in a space between output gate 66 and the last phase electrode 65. A portion 61D of channel 61 lies beneath electrodes 201-203 and couples to output diode 67. In addition, a portion 130D of channel 130 lies beneath the first and second set of electrodes 210-203; while a portion 190a of channel 190 lies beneath only the first set of electrodes 210-203.

Figure 24:
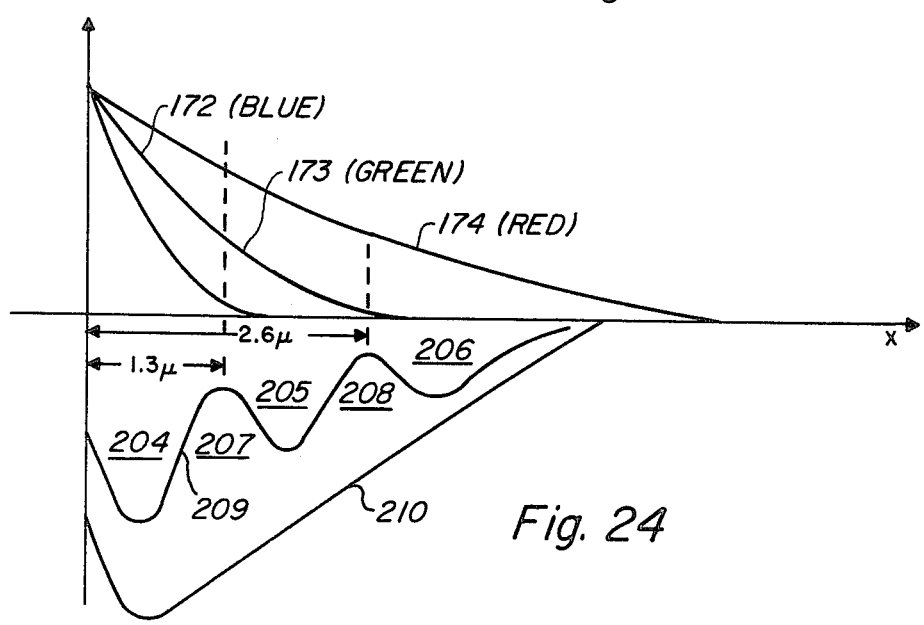
FIG. 24 is a set of curves illustrating the potential at various points within the eighth embodiment.

One preferred use for the eighth embodiment is as a single sensor color camera. To this end, channels 61, 130, and 190 are constructed to have potential wells 204-206 which are separated by specially located potential barries 207 and 208. Barrier 207 has a peak at approximately 1.3 microns whereas barrier 208 has a peak at approximately 2.6 microns beneath insulating layer 62. A suitable potential profile is illustrated via a curve 209 in FIG. 24. As before, the location of wells 204-206 is not critical. Also included in FIG. 24 are the previously described curves 172-174 indicating the rate at which charge carriers are generated in the device at various distances from insulating layer 62 in response to blue light, green light, and red light. Comparison of curves 172-174 to the location of potential wells 204-206 illustrates that the magnitude of the charge carriers which are accumulated in a particular potential well is dependent upon the wavelength of the incident light. In particular, with the potential profile indicated by curve 209, the charge packets accumulated in well 206 is a measure of approximately 29% of the intensity of the red light which falls indicent to the insulating layer 62 plus 14% of the green light and 0% of the blue light. Similarly, the charge packets accumulated in well 205 is a measure of approximately 26% of the red light plus 24% of the green light plus 11% of the blue light which falls incident to insulating layer 62; while the magnitude of charge packets acumulated in well 204 is a measure of approximately 45% of the red light plus 62% of the green light plus 93% of the blue light which falls incident to insulating layer 62. By sequentially reading the charge packets from wells 204, 205, and 206, output signals S204, S205 and S206 respectively are generated on which an inverse transform will yield three signals B, G, and R indicating the magnitude of the blue light, green light, and red light which falls incident to the insulating layer 62.

Stage 200 provides a means for sequentially reading the charge with FIG. 17. To begin, light from an image to be detected, is directed to fall on insulating layer 62. This condition lasts for a suitably long charge integration time interval. Subsequently, one set of three charge packets are propagated in piggyback fashion via wells 206, 205, and 204 along channels 61, 130, and 190 respectively to under the first set of control electrodes 201-203. At this point, the clocking signals on phase electrodes 63-65 are frozen while a voltage sequence is applied to control electrodes 201-203 to laterally separate the three charge packets. To begin, two cycles of three phase clocking signals are applied to control electrodes 201-203. In response thereto, the charge packet in potential well 206 of region 190D moves back and forth under the first set of control electrodes; the charge packet in potential well 205 of region 130D moves to underlie the second set of control electrodes 201-203; and the charge packet in potential well 204 of region 61D moves to underlie the third set of control electrodes 201-203. These charge packet take their respective positions since the channel portions in which they lie terminate at predetermined points within stage 200.

Subsequently, a relatively large voltage pulse is applied to each of the control electrodes 202. In response thereto, the potential profile beneath control electrodes 202 assumes a shape whereby the potential barriers between channel 61, 130, and 190 collapse. Curve 210 in FIG. 24 illustrates the general profile of the potential under electrodes 202 when a suitably high interchannel transfer voltage (e.g., 30 volts) is applied. In this manner charge packets in stage 200 are transferred to charge transfer channel 61. Subsequently, the interchannel transfer voltage is removed from electrodes 202, which causes all of the charge packets in stage 200 to be trapped in potential wells 204 under electrodes 202. These charge packets are then serially propagated along channel portion 61d and detected via output diode 67.

Various specific embodiments of the invention have now been described in detail. Further, many changes and modifications can be made to the above details without departing from the nature and spirit of the invention. For example, all of the embodiments may be utilized as an imager which is front side illuminated. Further, in a front side illumination mode of use, charge packets generated by visible light may be accumulated in the charge transfer channel, while charge packets generated by infrared light may simultaneously be accumulated in the underlying charge integration regions. This is possible, since photons of visible light generate carriers relatively near to the substrate surface (as was previously described in conjunction with FIGS. 22 and 24); whereas photons of infrared light generate carriers at a relatively uniform rate thoughout the substrate. Accordingly, carriers generated by visible light and infrared light will be separated by physically constructing the barrier region (which lies between the charge transfer channel and charge integration region) to have a potential maximum at approximately 4.0 microns beneath the substrate surface.

Figure 23:
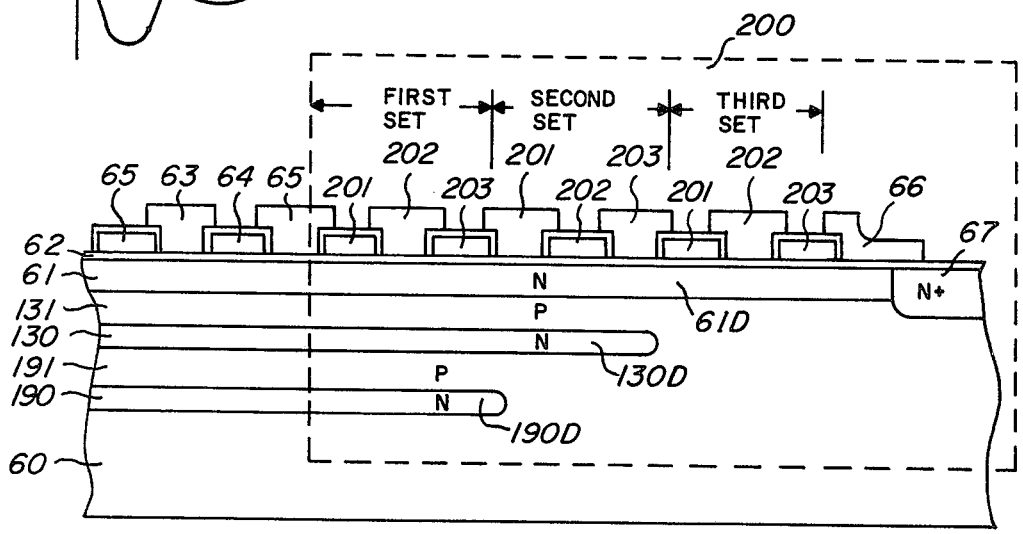
FIG. 23 is a greatly enlarged cross sectional view of an eighth embodiment of the invention.

As another example of a modification to the above-described details, the single chip color imager of FIG. 23 may be constructed with an output stage having an architecture similar to the output stage of FIG. 19. That is, the output stage would include three diodes, each of which is respectively connected to one of the three charge accumulation regions. Output gate electrodes would lie between a phase electrode and the diodes to control the flow of charge thereunder. Accordingly, since many changes and modifications can be made to the above details without departing from the nature and spirit of the invention, it is to be understood that the invention is not to be limited to said details except as set forth in the appended claims.

What is claimed is:

1. A charge coupled device comprised of:
   (a) a semiconductor substrate having dopant atoms of a first conductivity type and a first surface;
   (b) a plurality of parallel charge transfer channels spaced apart by separating regions, said channels and separating regions lying in said substrate near said first surface;

(c) an insulating layer lying over said charge transfer channels and separating regions;

(d) a plurality of phase electrodes serially disposed on said insulating layer transversely of said charge transfer channel;

(e) a barrier region in said substrate lying under and adjacent to all of said charge transfer channels and said separating regions, said barrier region having dopant atoms of said first type;

(f) a charge integration channel in said substrate lying under and adjacent to said barrier region, said charge integration channel having dopant atoms of a second conductivity type opposite to said first type; and (g) inter-channel transfer means for varying the potential under selected portions of predetermined ones of said electrodes by a relatively large degree in comparison to the potential under the remaining portion of said predetermined electrodes, each selected portion respectively lying within only one channel to enable charge transfer from the charge integration region under the corresponding predetermined electrode to said respective one channel.

2. A charge coupled device according to claim 1 wherein said phase electrodes are four-phase electrodes.

3. A charge coupled device according to claim 2, wherein said plurality of parallel channels consists of two channels, one of said channels having said interchannel transfer means under electrodes of a first phase and the other channel having said interchannel transfer means under electrodes of a third phase.

4. A charge coupled device according to claim 1, wherein said interchannel transfer means is comprised of selected portions of said predetermined phase electrodes, said selected portions overlying said respective channels and being electrically separable from the remainder portions of said predetermined phase electrodes such that separate clocking signals may be applied thereto.

5. A charge coupled device according to claim 4, wherein said plurality of channels consists of two channels, and said predetermined phase electrodes are split-electrodes having two portions with each portion respectively overlying one of said two channels.

6. A charge coupled device according to claim 5, wherein said phase electrodes are two-phase electrodes.

7. A charge coupled device according to claim 6 and further including an electrode lying between said phase electrodes in said separating region to form a selective channel stop.

8. A charge coupled device according to claim 1, wherein said charge transfer channel is a buried channel having dopant atoms of said second type.

9. A charge coupled device according to claim 1, wherein said substrate has a thickness in the range of 4.0 to 20.0 microns.

10. A charge coupled device according to claim 1, wherein said first type atoms are P-type and said second type atoms are N-type.

* * * * *